United States Patent
Diehl et al.

(10) Patent No.: US 8,995,483 B2
(45) Date of Patent: Mar. 31, 2015

(54) METHODS AND APPARATUS FOR TEMPERATURE TUNING OF SEMICONDUCTOR LASERS

(71) Applicant: EOS Photonics, Inc., Cambridge, MA (US)

(72) Inventors: Laurent Diehl, Cambridge, MA (US); Christian Pfluegl, Medford, MA (US); Mark F. Witinski, Cambridge, MA (US)

(73) Assignee: EOS Photonics, Inc., Cambridge, MA (US)

( * ) Notice: Subject to any disclaimer, the term of this patent is extended or adjusted under 35 U.S.C. 154(b) by 80 days.

(21) Appl. No.: 13/715,482

(22) Filed: Dec. 14, 2012

(65) Prior Publication Data

US 2013/0156052 A1    Jun. 20, 2013

Related U.S. Application Data

(60) Provisional application No. 61/576,679, filed on Dec. 16, 2011.

(51) Int. Cl.

| | | |
|---|---|---|
| *H01S 3/04* | (2006.01) | |
| *H01S 5/06* | (2006.01) | |
| *H01S 5/024* | (2006.01) | |
| *H01S 5/12* | (2006.01) | |
| *H01S 5/22* | (2006.01) | |
| *B82Y 20/00* | (2011.01) | |
| *H01S 5/00* | (2006.01) | |
| *H01S 5/026* | (2006.01) | |
| *H01S 5/0625* | (2006.01) | |

(Continued)

(52) U.S. Cl.

CPC .......... *H01S 5/0612* (2013.01); *H01S 5/02461* (2013.01); *H01S 5/12* (2013.01); *H01S 5/2224* (2013.01); *B82Y 20/00* (2013.01); *H01S 5/0014* (2013.01); *H01S 5/0261* (2013.01); *H01S 5/0265* (2013.01); *H01S 5/06258* (2013.01); *H01S 5/3402* (2013.01); *H01S 5/4031* (2013.01); *H01S 5/4087* (2013.01); *H01S 5/222* (2013.01)

USPC ....... 372/34; 372/36; 372/38.07; 372/50.122; 372/96

(58) Field of Classification Search
USPC .................. 372/34, 38.07, 50.12, 50.122, 96
See application file for complete search history.

(56) References Cited

U.S. PATENT DOCUMENTS

| | | | |
|---|---|---|---|
| 7,826,509 B2 | 11/2010 | Belkin et al. | |
| 2002/0034204 A1* | 3/2002 | Iwamoto et al. | ................ 372/46 |
| 2005/0018721 A1 | 1/2005 | Kish et al. | |

(Continued)

OTHER PUBLICATIONS

Andreas Wittmann et al., "Distributed-Feedback Quantum-Cascade Lasers at 9 μm Operating in Continuous Wave Up to 423 K," IEEE Photonics Technology Letters, vol. 21, No. 12, Jun. 15, 2009.

(Continued)

*Primary Examiner* — Yuanda Zhang
(74) *Attorney, Agent, or Firm* — Cooley LLP

(57) ABSTRACT

The present technology relates to a fast and efficient heating element based on a thick heterostructure which is monolithically integrated in close proximity to one or more components of a photonic or an electronic circuit. Inventive embodiments also relate to methods of use illustrative heating elements to control or tune the characteristics of the electronic or photonic component(s). Inventive embodiments may be particularly useful in the fast spectral tuning of the emission wavelength of single mode QCLs.

23 Claims, 10 Drawing Sheets

CROSS SECTION

(51) Int. Cl.
*H01S 5/34* (2006.01)
*H01S 5/40* (2006.01)

(56) References Cited

U.S. PATENT DOCUMENTS

2010/0142568 A1* 6/2010 Arimoto et al. ............... 372/20
2010/0272133 A1* 10/2010 Kato ............................. 372/20

OTHER PUBLICATIONS

Antonia Lops et al., "Thermal modeling of GaInAs/AlInAs quantum cascade lasers," Journal of Applied Physics 100, 043109 2006.
C. Gmachl et al., "Single-Mode, Tunable Distributed-Feedback and Multiple-Wavelength Quantum Cascade Lasers," IEEE J. Quant. Elec. 38(6):569-581 (2002).
Gmachl et al., "High-power, continuous-wave, current-tunable, single-mode quantum-cascade distributed-feedback lasers at $\lambda \approx 5.2$ and $\lambda \approx 7.95$ µm," Optics Letters, vol. 25, No. 4, Feb. 15, 2000.
J. S. Yu, S. Slivken et al., "High-power, room-temperature, and continuous-wave operation of distributed-feedback quantum-cascade lasers at $\lambda \approx 4.8$ µm," Applied Physics Letters 87, 041104 2005.
L. A. Wang et al., "Integrated Four-Wavelength DFB Laser Array with 10 Gb/s Speed and 5 nm Continuous Tuning Range," IEEE Photonics Technology Letters 4(4): 318-320 (Apr. 1992).
L. Diehl et al., High-power quantum cascade lasers grown by low-pressure metal organic vapor-phase epitaxy operating in continuous wave above 400 K, Applied Physics Letters 88, 201115 2006.
Shinji Sakano et al., Tunable DFB Laser with a Striped Thin-Film Heater, IEEE Photonics Technology Letters, vol. 4, No. 4, Apr. 1992.
T. Kameda et al., A DBR Laser Employing Passive-Section Heaters, with 10.8 nm Tuning Range and 1.6 MHz Linewidth, IEEE Photonics Technology Letters, vol. 5, No. 6, Jun. 1993.

* cited by examiner

METHODS AND APPARATUS FOR TEMPERATURE TUNING OF SEMICONDUCTOR LASERS

RELATED APPLICATIONS

This application claims a priority benefit, under 35 U.S.C. §119(e), to U.S. Provisional Patent Application No. 61/576,679, filed Dec. 16, 2011, entitled "METHODS AND APPARATUS FOR TEMPERATURE TUNING OF SEMICONDUCTOR LASERS," which provisional application is hereby incorporated by reference herein in its entirety

BACKGROUND

The performance and characteristics of an electronic or a photonic device usually depend on the temperature at which the device is operated. The function of certain devices is sometimes based on this dependence. A well-known example is the red-shift of the emission wavelength of a distributed feedback (DFB) semiconductor laser with increasing temperature. This dependence can be used to maintain the emission wavelength to a specific value, as may be desirable for instance in a communication system, or to tune the emission wavelength over a spectral range overlapping with an absorption feature of an analyte, as in most laser-based gas sensors.

Currently, DFB quantum cascade lasers (QCLs) (see, e.g., C. Gmachl et al. IEEE J. of Quantum Electron. 38, 569 (2002), which is incorporated herein by reference in its entirety) are the most widely used single mode semiconductor laser sources in the mid-infrared portion of the electromagnetic spectrum. The optical cavity of these devices incorporates a Bragg grating acting as a wavelength filter that results in single mode emission. Distributed Bragg reflector (DBR) lasers and sampled grating DBR (SG-DBR) lasers are other well-known examples of devices having a single mode emission. Unlike DFB lasers however, these devices are composed of several independent sections, including typically a gain section, one or more sections with a Bragg grating and one phase shift section as discussed in L. Coldren and S. Corzine, *Diode Lasers and Photonic Integrated Circuits*, New York Wiley, 1995. Wavelength tuning in single mode QCLs is achieved by changing the temperature of the optical waveguide as a whole or in selected parts of the laser cavity, especially where gratings are present. The temperature change translates in a change of the mode effective refractive index, which is directly related to the wavelength selected by a Bragg grating.

Changing the temperature of a QCL waveguide results in wavelength tuning. This is usually achieved by two different mechanisms, also commonly used to tune the emission wavelength of other types of lasers such as diode lasers:

(1) Direct Current Tuning

Changing the current flowing through a QCL changes typically its core temperature by a large amount, because the QCL gain medium (1) requires high current (0.5 to 4 Amp.) and voltage (8 to 18 Volts), i.e., high input electrical power, (2) is highly inefficient, e.g. 80% to 90% of the electrical power provided to the laser is not transformed into photons but instead is dissipated in heat and (3) has very poor thermal conductivity on the order of 2 W/(m K). Fast tuning rates reaching hundreds of kHz and more is possible with this mechanism, because the temperature changes take place only in a very small volume of the device. However, the tuning achievable is rather limited, and therefore the tuning range achievable by this mechanism is bound to only 3 $cm^{-1}$ to 6 $cm^{-1}$. This limit originates from the fact that QCLs operate (i.e. emit light efficiently) only up to certain operating current, after which the laser intensity starts to decrease sharply (roll over). The maximum operating current, and therefore the maximum electrical power dissipated in the waveguide core translates into a maximum temperature change of typically less than 50K. For more details, see, e.g., C. Gmachl et al. Optics Lett. 25 230 (2000).

(2) Heatsink Temperature Tuning

Wavelength tuning can be achieved by changing the temperature of the DFB QCL chip as a whole, through a temperature variation of the mount and/or heatsink to which the laser chip is attached. As discussed in A. Wittman, et al., IEEE Photon. Tech. Lett., 21 814 (2009), which is incorporated herein by reference in its entirety, tuning range reaching ~15 $cm^{-1}$ in the long-wave infrared or LWIR (i.e. λ~8-12 µm) can be achieved by varying the heatsink temperature from 245K to 425K. This corresponds to a tuning coefficient in the range of 0.075 $cm^{-1}$/K. Slightly broader tuning (~20 $cm^{-1}$) was achieved at shorter wavelength (i.e. λ<5 µm), as discussed in J. S. Yu et al., Appl. Phys. Lett. 87, 41104 (2005), which is incorporated herein by reference in its entirety. This is a significantly broader tuning range compared to the value achievable by current tuning alone. Tuning the temperature of the heatsink is not limited by the maximum current that the laser can sustain, but rather by the much larger temperature range over which the laser can reach threshold (200K or more). This mechanism is very convenient but the tuning speed is typically extremely slow, on the order of seconds up to a few minutes. This is due to the long time necessary to heat up and cool down the large mass of the heatsink and the other components to which the laser is directly or indirectly connected. In the case of photonic chips that include an ensemble of temperature-sensitive elements (for example a DFB QCL array as described in U.S. Pat. No. 7,826,509 B2 to Belkin et al., which is incorporated herein by reference in its entirety), this tuning method forces the operating temperature of the different elements to change by a similar value, which may not be desirable for some applications.

Another tuning method involves integrating resistive thin film heaters directly on top of passive sections of DBR lasers. This approach is most commonly applied to single mode diode lasers and has been demonstrated in the early 1990's as discussed for example in S. Sakano et al., IEEE Photon. Tech. Lett. 4, 321 (1992), [1]T. Kameda et al., IEEE Photon. Tech. Lett. 5, 608 (1993), and F. A. Kish et al, US patent 2005/0018721A1, each of which is incorporated herein by reference in its entirety. Resistive thin film heaters include typically a metal such as Au, Pt, Pt/Ti, NiCr, TaN and an insulator deposited next to or directly on top of the electric contacts used to control the device below. The insulator prevents an electric short between the heater and other parts of the laser, in particular electrodes. Joule heating takes place as current is injected in the thin, resistive metal layer, which results in a temperature increase and hence a refractive index change in the DBR laser. This approach however does not easily allow for the large temperature changes (100K and higher) desirable for QCLs because of the limited electrical power (typically less than a few Watts) that a thin film can sustain before degrading, causing reliability problems. Finally, the fact that the heater is fabricated directly on top of the device may also prevent epitaxial-side down mounting.

SUMMARY

In view of the foregoing, various inventive embodiments disclosed herein relate generally to a new apparatus that comprises a fast and efficient heating element based on a thick heterostructure and which is monolithically integrated in close proximity, e.g. 5 to 25 μm to one or more components of a photonic or an electronic circuit. Embodiments of the present technology also relate to methods of use illustrative heating elements to control or tune the characteristics of the electronic or photonic component(s). Inventive embodiments may be particularly useful in the fast spectral tuning of the emission wavelength of single mode QCLs.

Embodiments including an apparatus, such as a photonic circuit, that comprises a substrate, a semiconductor device, and a heterostructure heater. The semiconductor device may be integrated onto the substrate and have at least one temperature-tunable property, e.g., refractive index, output power, resistivity, etc. The heterostructure heater may also be integrated onto the substrate such that it is in thermal communication with the semiconductor device. When actuated, the heterostructure heater heats the semiconductor device so as to vary (or tune) the semiconductor device's temperature-tunable property. For instance, the heterostructure heater may transform electrical power into heat, via the Joule effect, with an efficiency of more than about 25% so as to heat the semiconductor device.

In exemplary embodiments, the semiconductor device may include one or more lasers or combinations of lasers, including but not limited to quantum cascade lasers (QCLs), interband cascade lasers, quantum well lasers, distributed feedback (DFB) lasers, distributed Bragg reflector (DBR) lasers. In such examples, the semiconductor device's temperature-tunable property may include the laser's output wavelength and/or output power. The heterostructure heater may heat the laser(s) so as to vary the output wavelength(s) by about 5 cm$^{-1}$ to about 40 cm$^{-1}$ in less than about 1 millisecond (e.g., by about 10 cm$^{-1}$, 15 cm$^{-1}$, 20 cm$^{-1}$, 25 cm$^{-1}$, 30 cm$^{-1}$, or 35 cm$^{-1}$ in about, e.g., 900 μs, 800 μs, 700 μs 600 μs, 500 μs, 400 μs, 300 μs, 200 μs, or 100 μs).

In other embodiments, the semiconductor device comprises at least one passive component, including but not limited to a phase shifter, an arrayed waveguide multiplexer, a router, a contra-directional coupler, a Mach-Zehnder interferometer, a filter, a modulator, a resonator, a tapped delay line, and an optical switch. In such examples, the semiconductor device's temperature-tunable property may include the passive component's refractive index.

In certain implementations, the heterostructure heater may include one or more quantum wells. The heterostructure heater and the semiconductor may be formed from one or more common epitaxial layers deposited on the substrate. When actuated, the heterostructure heater may increase in temperature by at least about 50 degrees Kelvin (e.g., 75 K, 100 K, 125 K, 150 K, 175 K, 200 K, 225 K, or 250 K) in less than about 1 millisecond (e.g., 900 μs, 800 μs, 700 μs 600 μs, 500 μs, 400 μs, 300 μs, 200 μs, or 100 μs).

Further embodiments may include a controller, operably coupled to the heterostructure heater, to control the heterostructure heater's temperature, e.g., by modulating or varying the voltage and/or current applied to the heterostructure heater.

Still other embodiments include a method of varying a temperature-tunable property of a semiconductor device integrated onto a substrate. The semiconductor device's temperature-tunable property may be varied with a heterostructure heater that is integrated onto the substrate and in thermal contact with the semiconductor device. This variation is controlled by controlling electrical power (e.g., current and/or voltage) injected into or applied to the heterostructure heater so as to vary the semiconductor device's temperature. Such a method may also include injecting the electrical power into the heterostructure heater, e.g., at a current density of up to about 10 kA/cm$^2$.

In some cases, a human user or electronic controller may determine a desired temperature of the semiconductor device associated with a particular value of the temperature-tunable property of the semiconductor device. This a human user or electronic controller may adjust (or cause an adjustment in) the electrical power injected into the heterostructure heater based on the comparison so as to bring the temperature of the semiconductor device closer to the desired temperature.

In certain examples, the semiconductor device comprises a first laser and the semiconductor device's temperature-tunable property comprises a first output wavelength of the first laser. In these examples, the human user or electronic controller may adjust the electrical power injected into the heterostructure heater so as to tune the first output wavelength over a first wavelength range about 5 cm$^{-1}$ to about 40 cm$^{-1}$ in less than about 1 millisecond (e.g., by about 10 cm$^{-1}$, 15 cm$^{-1}$, 20 cm$^{-1}$, 25 cm$^{-1}$, 30 cm$^{-1}$, or 35 cm$^{-1}$ in about, e.g., 900 μs, 800 μs, 700 μs 600 μs, 500 μs, 400 μs, 300 μs, 200 μs, or 100 μs). The semiconductor device may further comprise a second laser and the semiconductor device's temperature-tunable property may further comprise a second output wavelength of the second laser. The human user or electronic controller may adjust the electrical power injected into the heterostructure heater (or into a second heterostructure heater) so as to tune the second output wavelength over a second wavelength range contiguous with or overlapping the first wavelength range.

Still further embodiments include a tunable laser array that comprises a substrate, a plurality of QCLs, a plurality of heterostructure heaters, and at least one independent electrode per heterostructure heater (the heaters may share a common ground or individual grounds). The QCLs and the heterostructure heaters may be integrated onto the substrate such that each heater is in thermal communication with at least one QCL. Each heterostructure heaters can receive current via its respective electrode; this current causes the respective heterostructure heater to change in temperature, which in turn causes the QCL(s) associated with the respective heterostructure to change in temperature. This temperature variation causes the associated QCL's output wavelength to vary.

The heterostructure heaters may each include one or more quantum wells and may have one or more epitaxial layers in common with the QCLs. In addition, each heterostructure heater may be about 12 μm to about 40 μm wide and may be disposed within about 5 μm to about 25 μm of its respective associated QCL(s). The laser array may also include at least one regrown heat-transfer layer, integrated onto the substrate between a QCL and a heterostructure heater, to transfer heat from the heterostructure heater to the QCL.

Each heterostructure heater may also be configured to heat its associated QCL so as to continuously vary the QCL's output wavelength by about 5 cm$^{-1}$ to about 40 cm$^{-1}$ in less than about 1 millisecond (e.g., by about 10 cm$^{-1}$, 15 cm$^{-1}$, 20 cm$^{-1}$, 25 cm$^{-1}$, 30 cm$^{-1}$, or 35 cm$^{-1}$ in about, e.g., 900 μs, 800 μs, 700 μs 600 μs, 500 μs, 400 μs, 300 μs, 200 μs, or 100 μs). Such temperature tuning may be implement with a controller that is operably coupled to the heterostructure heaters. This controller may control the heterostructure heaters so as to tune the output wavelengths of the QCLs in the array, e.g., to one or more desired wavelengths.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Figure 1:
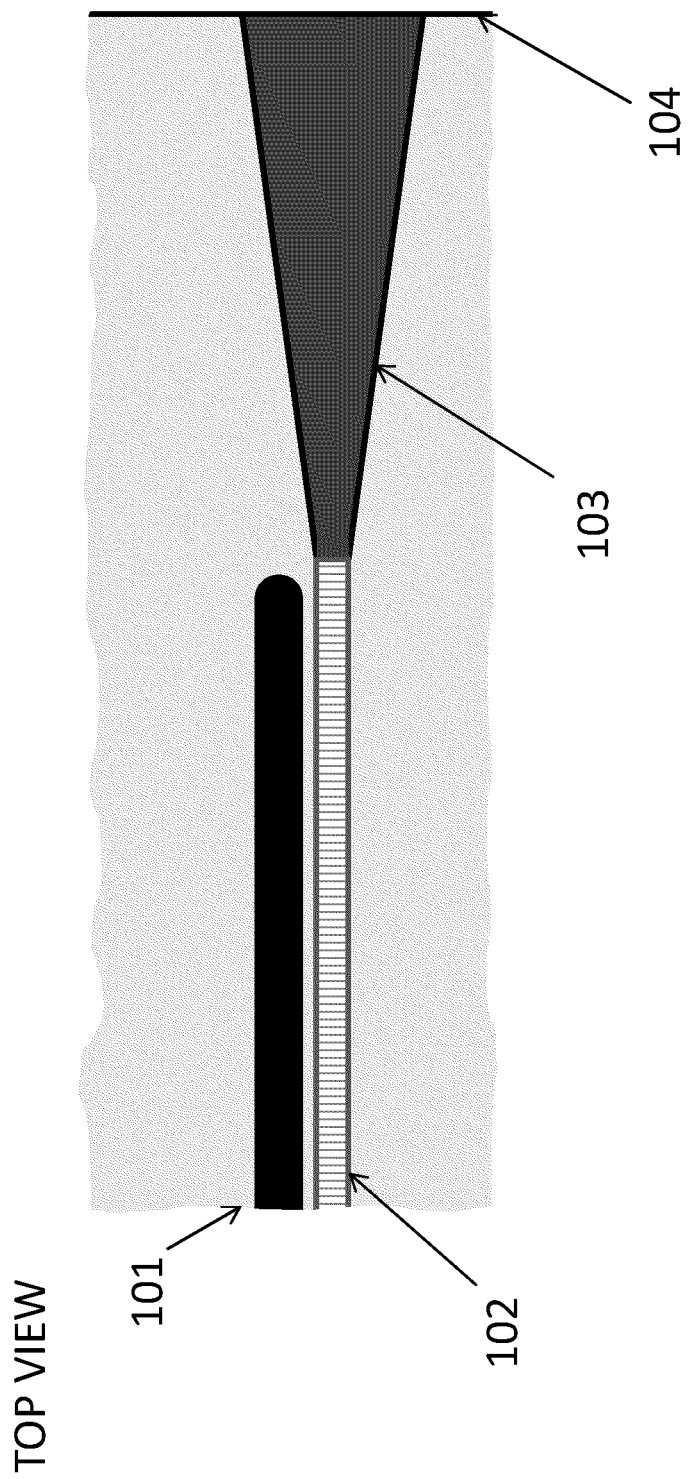
FIG. 1 shows a schematic top view of a DFB QCL with a heterostructure heater and an integrated power amplifier, according to embodiments of the present invention.

Following below are more detailed descriptions of various concepts related to, and embodiments of, inventive systems, methods and apparatus for a heterostructure used as a monolithically integrated heating element. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

One embodiment of the present technology includes an apparatus for integrating monolithically a heating element based on a heterostructure in close proximity to an electronic or a photonic device. One embodiment includes a heterostructure heating element fabricated next to the part of a single mode laser where wavelength selection occurs to achieve fast spectral tuning over an extended wavelength range. In the case of a tunable single mode QCL, the integrated heterostructure heater comprises an electrically addressable ridge or mesa fabricated from the same epitaxial layers used for the realization of the QCL. Pumping current through the heterostructure heater increases significantly its temperature and the temperature the neighboring laser section because of the short distance between the two elements. The induced temperature change enables fast spectral tuning because of the small volume of material that is heated. Calculations show that under conservative assumptions, the temperature change that is typically achieved with heatsink temperature tuning (typically 200 K) can be achieved in less than a millisecond, i.e. three to four orders of magnitude faster than with heatsink temperature tuning. This technology is not limited to QCLs and can be used with other laser gain media that are composed of quantum wells and barriers such as interband cascade lasers (see for example C. L. Canedy et al., Appl. Phys. Lett. 88, 161103 (2006), which is incorporated herein by reference in its entirety) and quantum well lasers (see for example S. Forouhar et al., Appl. Phys. Lett. 100, 31107 (2012), which is incorporated herein by reference in its entirety).

The inventive embodiments disclosed herein enable tuning of a distributed feedback QCL over a spectral range which is three to five times broader compared to direct current tuning, with only a small penalty in terms of tuning speed which is acceptable for most applications. A method to tune the emission wavelength of a source comprising at least one single mode QCL and one heterostructure heater is disclosed. A method to control and maintain the emission wavelength of a source comprising at least one single mode QCL and one heterostructure heater is also disclosed. The heaters discussed here can be combined not only with single device such as a DFB emitter or other types of single mode QCLs such as DBR QCLs and SG-DBR QCLs, but also with arrays of such single emitters. Inventive embodiments are not limited to tuning the emission wavelength of single mode QCLs. They can also be used to control a temperature-dependent characteristic such as the phase, resistance, amplification, reflection, transmission or absorption characteristics or output power in integrated elements. The heaters can also be used in combination with one or more other integrated optical or electronic elements such as phase shifters, arrayed waveguide multiplexers, routers, optical couplers, contra-directional couplers, Mach-Zehnder interferometers, filters, modulators, resonators, tapped delay lines, optical switches, detectors, transistors, in monolithic photonic or electronic circuits.

Embodiments of the present technology include the monolithic integration of at least one heating element that includes a thick heterostructure (thickness of the order of 0.5 to 5 µm), in close proximity (separation of the order of 5 to 25 µm) to for example the wavelength-selective section or the phase-shift section of a single mode laser or any other integrated optical or electronic element. A heterostructure includes a stack of nanometer-scale semiconductor layers, InGaAs/InAlAs, GaAs/AlGaAs, InGaAs/AlAs(Sb), InAs/GaInSb/AlSb/ GaSb/InAs/AlInSb or Si/SiGe, forming quantum wells and barriers. These layers are grown on a semiconductor substrate, which may be one of the following materials: InP, GaAs, GaSb, Si or SiGe. The heterostructure may be unipolar, e.g., doped with only one type of dopant, which allows the transport of either only electrons or only holes through the entire stack.

In one embodiment, the integrated optical or electronic element positioned nearby the heterostructure heater is a single mode QCL processed in a DFB geometry. FIG. 1 shows a schematic top view of a DFB QCL (101) with a heater element (102). The laser light emitted in the DFB QCL (101) is coupled into an integrated power amplifier (103) in the particular case disclosed. The laser beam exits the power amplifier (103) through an antireflection coating (104) deposited on the output facet (105). Note that the power amplifier (103) and the antireflection coating (104) are not essential to achieve spectral tuning of the emission wavelength of the DFB QCL (101) using the heater (102). These two elements (103) and (104) are used as a mean to increase or control the output power of the laser sources. The electrical contacts that allow electrical pumping of the different elements shown are not shown here for simplicity.

Figure 2:
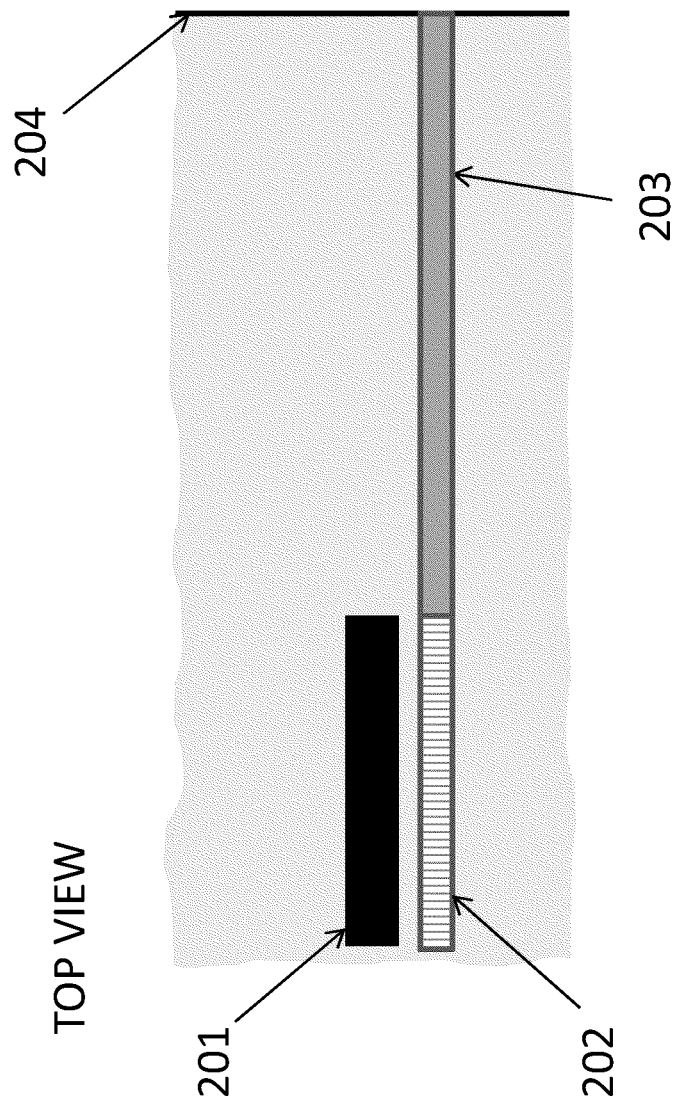
FIG. 2 shows a schematic top view of a distributed Bragg reflector laser with a heterostructure heater and an integrated power amplifier, according to embodiments of the present invention.

FIG. 2 shows a schematic top view of a DBR QCL (201) with a heater element (202). In the particular embodiment shown, the optical cavity of the DBR QCL (201) is formed by the cleaved output facet (203) and a DBR section (204) acting as a wavelength selective mirror. The optical gain used to achieve lasing action is provided by a QCL gain section (204). The electrical contacts that allow electrical pumping of the different elements shown are not shown here for simplicity.

Figure 3:
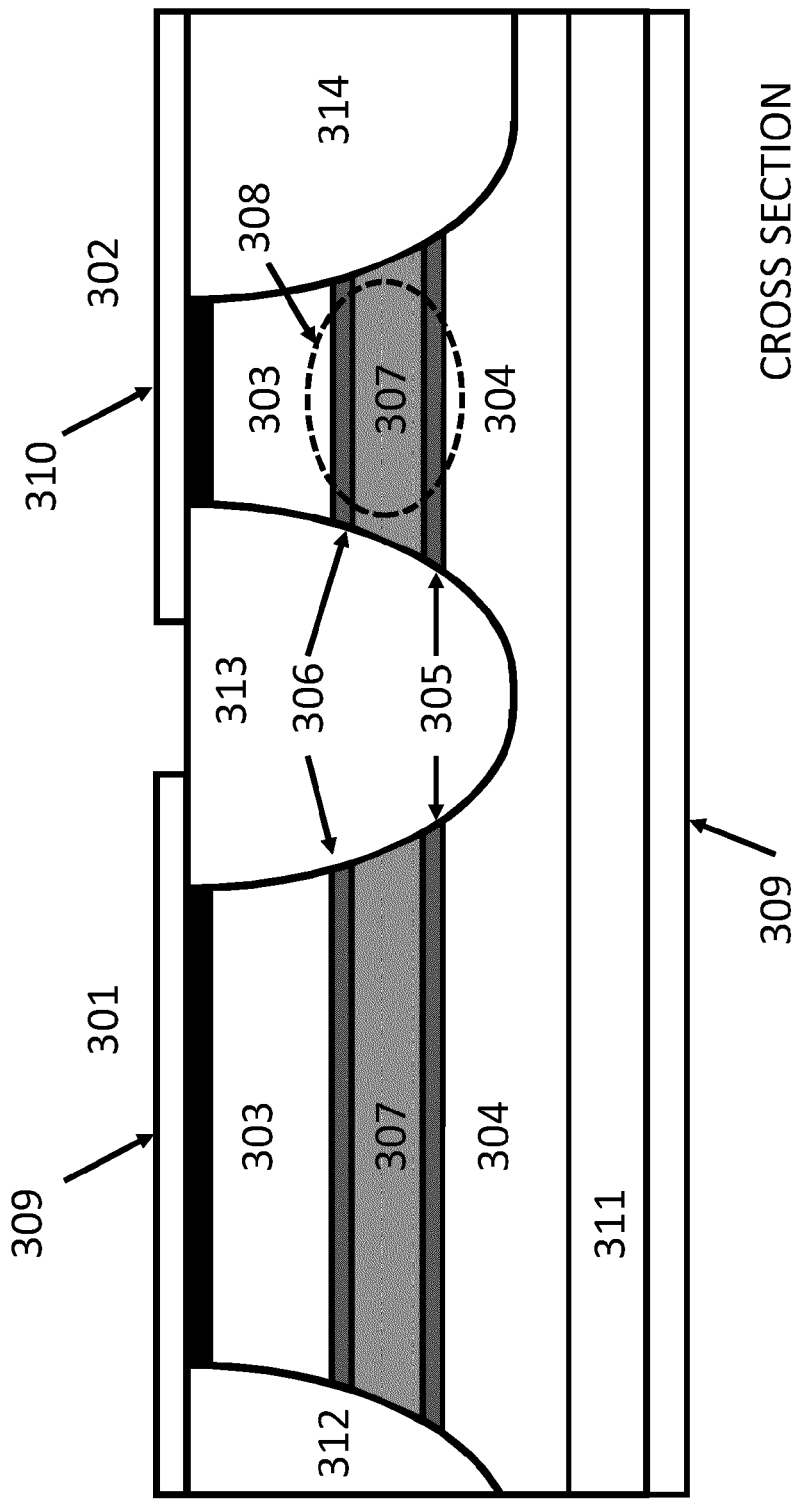
FIG. 3 shows the cross section and the temperature distribution of a single mode buried heterostructure QCL with an integrated heater, according to embodiments of the present invention.

FIG. 3 displays a schematic cross section of an heterostructure heater (301) next to the wavelength-selective section (302) of a single mode laser. The wavelength-selective section (302) can be for example a DBR section (203) or a DFB laser (101). The heater (301) is formed by a ridge or mesa fabricated from the same epitaxial material as the QCL. The latter is formed by two cladding layers (303) and (304) that surrounds two InGaAs layers (305) and (306) as well as the gain medium (307). The Bragg grating used for wavelength section in DBR or DFB QCL is typically etched in the layer (306). The dashed line (308) in FIG. 3 symbolizes the optical mode supported by the QCL waveguide. The heater (301) and the laser element (302) can be electrically addressed independently using the two independent contacts (309) and (310) and a common electrical ground (310) at the bottom of the substrate (311). The heater (301) is placed in close proximity (less than 25 µm) to at least part of the length of a laser section, as shown for example in FIGS. 1 and 2. The QCL may be processed into a buried heterostructure (BH) geometry, i.e., with insulating Fe-doped InP regrown (312), (313) and (314) on the sides of the laser ridge (302) and the heater (301) as discussed in L. Diehl, D. Bour, S. Corzine, J. Zhu, G. Hoefler, M. Loncar, M. Troccoli, and Federico Capasso *Appl. Phys. Lett.* 88, 201115 (2006), which is incorporated herein by reference in its entirety. The Fe-doped regrown layer (312), (313) and (314) acts as electrical insulation and is transparent in the mid-infrared, providing lateral confinement for the optical laser mode without increasing optical losses. This regrown InP layer also has a high thermal conductivity (63 K/(m*W)), which helps to efficiently and quickly either extract heat from the QCL waveguide or to transfer heat from the integrated heater to the QCL depending if cooling or heating of the laser is desirable. In other embodiments, the Fe:doped InP layer may be replaced by other thermally conductive materials which include InGaAs, InAlAs, or metals such as gold.

The gain medium of QCLs is one example of a unipolar heterostructure that can be used as an integrated heater. Embodiments of the present technology take advantage of several unique characteristics of QCLs, which are also generally true for unipolar heterostructures, such as: large electrical input power (QCLs can support reliably very high current densities and require high voltage, which translates in large electrical input power reaching tens of Watts); poor efficiency (QCLs may be inefficient devices, which means that a small fraction of the electrical power provided to the laser is transformed in useful optical power. In most QCLs, more than 80 to 90 percent of the input electrical power is transformed in heat instead of photons, the efficiency is far less than 1% if the structure is not lasing and operates as a light emitting diode (LED)); and poor thermal conductivity (the gain medium of QCL is composed by hundreds of nanometer-scale semiconductor layers forming as a whole a particularly region with poor thermal conductivity as discussed for example in A. Lops et al, J. Appl. Phys. 100, 43109 (2006), which is incorporated herein by reference in its entirety). In comparison, the gain medium of interband diode lasers or LED is less suited to work well as a heater mainly because the electrical power involved (typically less than 0.5 Watt) is much less than for QCLs (tens of Watts). A large portion of the electrical power delivered is also transformed into optical power (between 5% to 22%). Also, it is significantly thinner (less than 500 nm) and composed of only a few quantum wells and barriers, which results in a low thermal resistance.

The large heat generated in a QCL ridge results in a large temperature increase at the center of the waveguide that may reach tens of Kelvins. This is particularly true if the device is operated in continuous wave and not in pulsed mode, since in the latter case, the gain medium can cool down between the electrical pulses. The same is true for the integrated heater disclosed here, except that temperature increases up to 200K and higher can be reached for the following reasons. In QCLs, the maximum current density is limited by the fact that above a certain bias, light emission through the laser becomes very inefficient. This limitation does not apply for the heater given that light emission is not important for this integrated element and therefore the maximum current density in the heater can be two to three times higher than for a laser.

Similarly, the geometry of the heterostructure heater may be a long rectangle similar to a ridge laser but it can also be significantly different from this shape. In particular the heater element does not need to form an optical resonator as it is not supposed to provide laser emission. The width of a QCL ridge is usually narrow (e.g., less than 15 µm) to limit heating and to prevent high order lateral modes to appear, as this leads for example to undesirable instabilities in the laser beam profile. The heterostructure heater disclosed herein is not limited in terms of width, which can be as large as 30 µm and wider. On the contrary, fabricating broad heating elements (e.g., with widths larger than 12 µm) increases the thermal resistance of the heater and the amount of heat generated.

Figure 4:
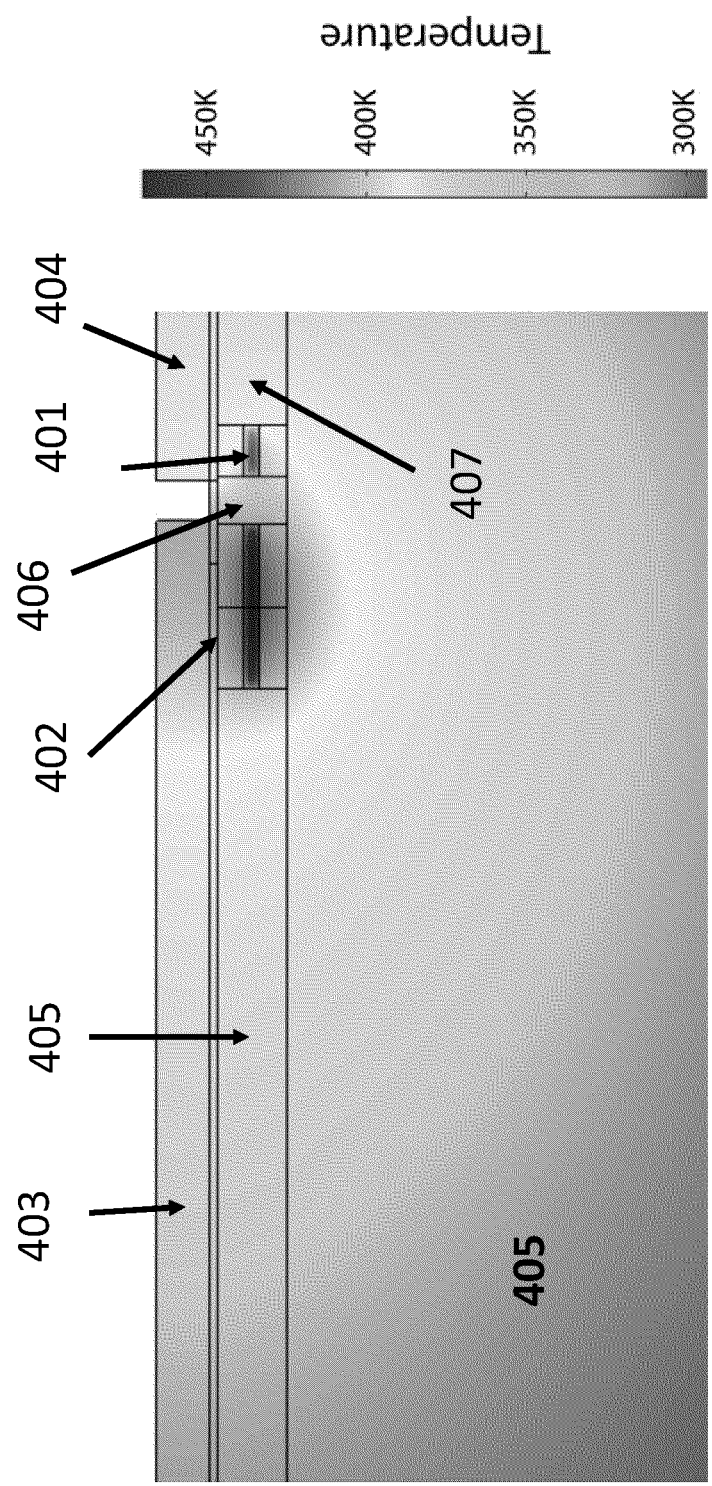
FIG. 4 shows the cross sectional view of a QCL ridge and an intersubband heater overlapped with the temperature map calculated, according to embodiments of the present invention.

FIG. 4 shows the cross section and the temperature distribution of a single mode BH QCL (401) with an integrated heater (402) similar to the geometry shown in FIG. 3. These two integrated elements (401) and (402) are connected electrically through two independent contacts (403) and (404). The InP substrate (405) and the Fe-doped InP region regrown (405), (406) (407) are also shown in FIG. 4. The temperature distribution was calculated with the commercial software COMSOL Multiphysics for two different cases: (a) current flowing in the heater only (current density 3 kA/cm$^2$) and (b) current flowing in both the QCL (current density 3 kA/cm$^2$) and the heater (current density 6 kA/cm$^2$). These calculations were performed assuming steady state conditions, i.e., only constant current and voltage were applied. The laser and integrated heater are assumed to be soldered epitaxial side up with AuSn to an AlN submount connected to a heatsink assumed to be at constant temperature of $T_{heatsink}$=243 K. The widths of the laser and the heater were 6 µm and 20 µm, respectively, and the separation between these two elements was 5 µm. Simulations suggest that the average temperature in the waveguide core is about 337 K when current flows in the heater only while this quantity reaches about 426 K when the QCL is also turned on (FIG. 4). Considerably larger temperature increase can be induced if larger current density is forced through the heater. However, calculations show that even a moderately large current density allows up to approximately double the temperature difference (temperature increase 96K) achievable by direct current tuning (temperature increase 89K). In addition, significantly larger temperature differences can be obtained for example by or by changing the geometry of the device and in particular adding a second heater element.

Figure 5:
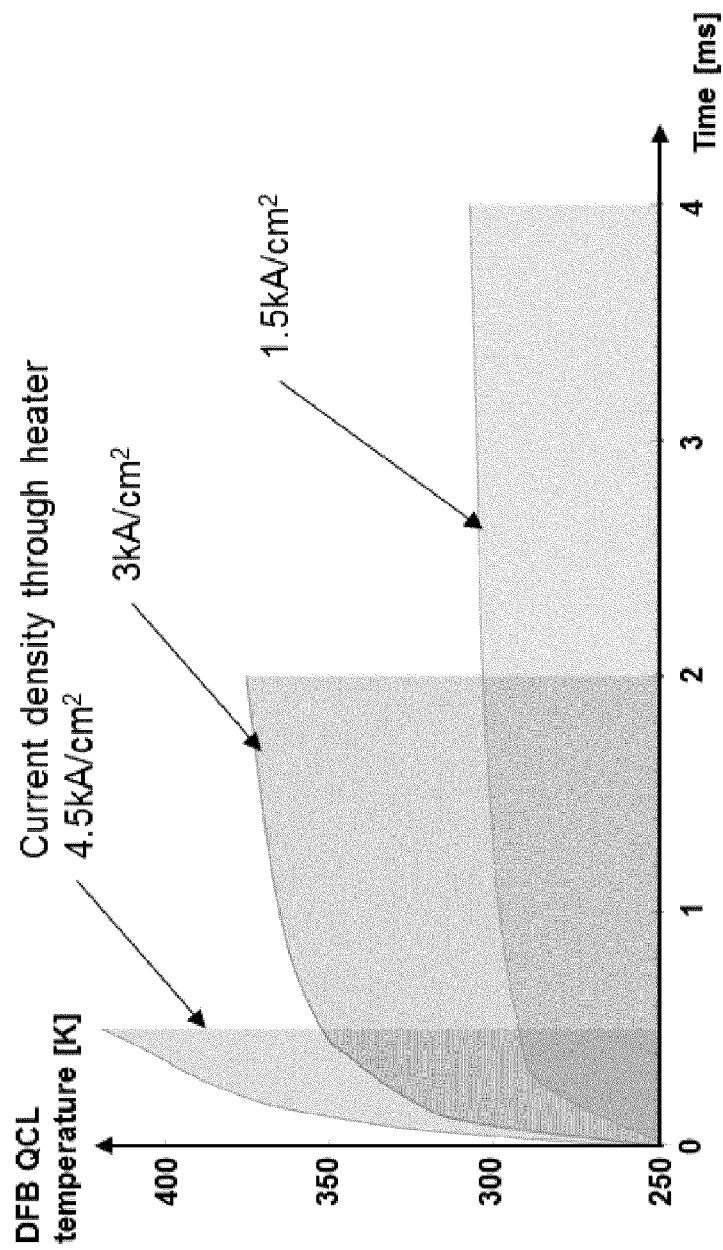
FIG. 5 shows the temporal dependence of the average temperature increase at the center of a QCL ridge surrounded by two heterostructure heaters for different current densities through the heaters, according to embodiments of the present invention.

In another embodiment, two heaters instead of one are placed on each side of a single mode QCL section to allow higher temperature changes to be induced by the heaters. Calculations using COMSOL Multiphysics yield the increase of temperature in the gain region of the single mode QCL section as a function of time and for various current densities in the heaters for this particular arrangement. In this example the widths of the QCL section and of the heaters were 10 and 20 µm, respectively, while the separation between these elements was 10 µm. Initially, i.e., at t<0 s, the heater and the QCL section are assumed to be unpumped. As a consequence, the temperature in the entire device is constant and equal to the heatsink temperature $T_{heatsink}$=243 K. For t≥0 s, an equal and constant current density is set to flow in the two heaters in the calculations while the QCL section remains unpumped. As shown in FIG. 5, the temperature in the QCL gain section increases rapidly even if the current density in the heaters is only moderately high, e.g., 3 kA/cm$^2$, which corresponds to the current density at which a QCL typically reaches maximum optical power. Much higher current densities (for example, 8-10 kA/cm$^2$) can be used for the heaters without significant risk of damage. Calculations show that the temperature of the single mode QCL section can be increased by 175 K in less than 500 µs with only 4.5 kA/cm$^2$ flowing in the heaters. This is approximately the same temperature increase for achieving about 15 cm$^{-1}$ to about 20 cm$^{-1}$ spectral tuning with DFB QCLs and obtained usually by changing the heatsink temperature. However, embodiments of the present technology allow this large tuning to take place more than ten thousand times faster, i.e., in less than a millisecond vs. minutes, which is highly desirable for a number of applications. Faster and more broadband tuning is expected by increasing the current density flowing through the heater.

Figure 6:
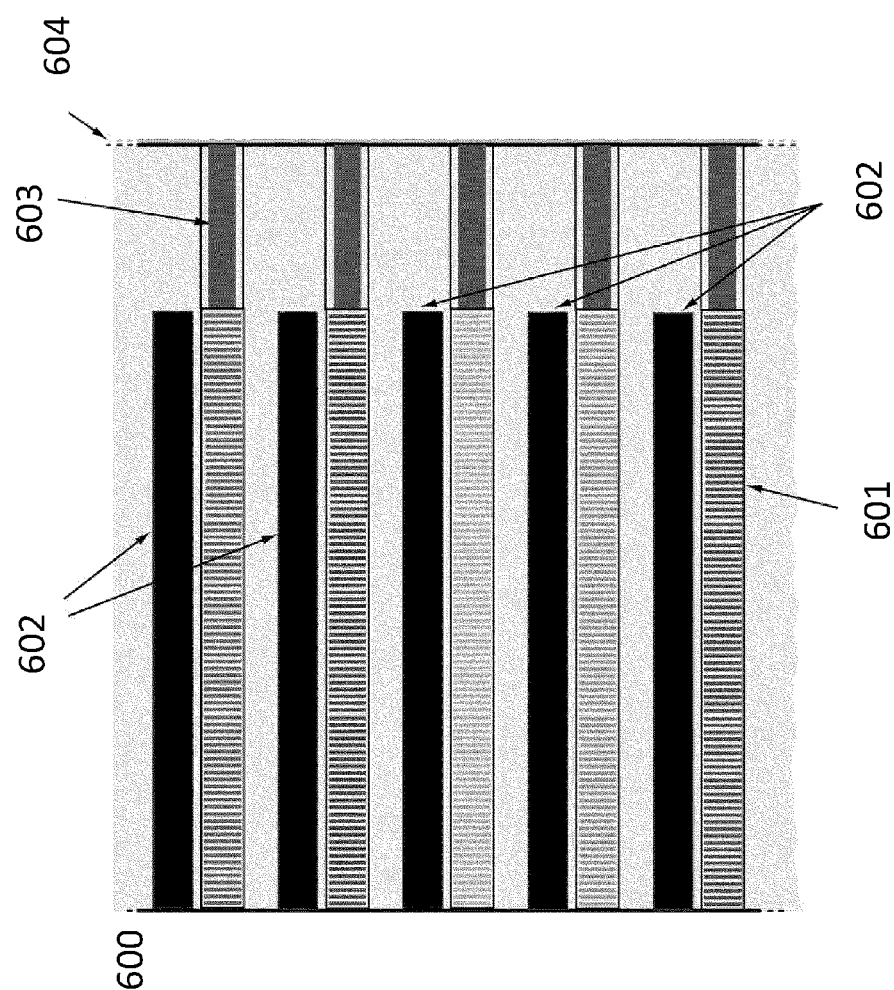
FIG. 6 shows a schematic top view of an array of DFB QCLs and heaters fabricated on the same chip and placed parallel to each other, according to embodiments of the present invention.
Figure 7:
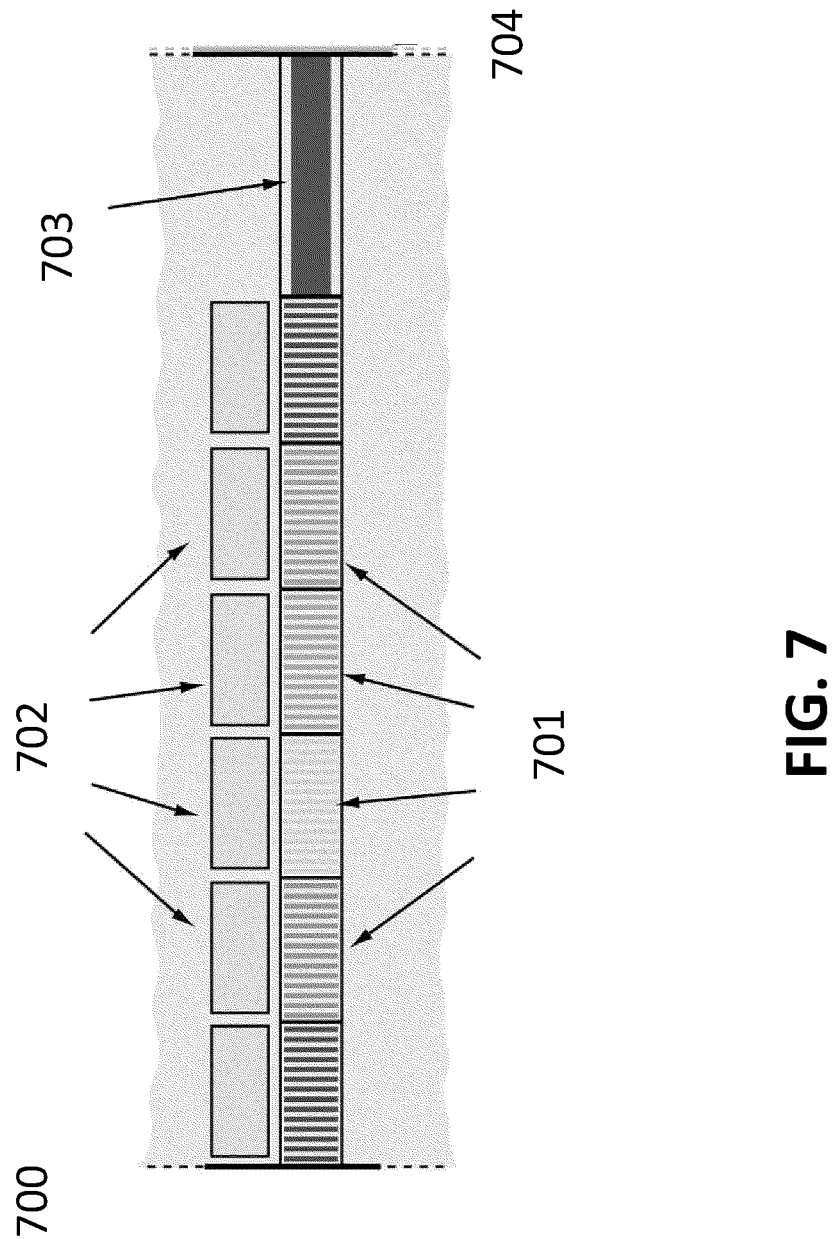
FIG. 7 shows a schematic top view of a tunable QCL source involving several DFB QCL sections and heterostructure heaters fabricated in series, according to embodiments of the present invention.
Figure 8:
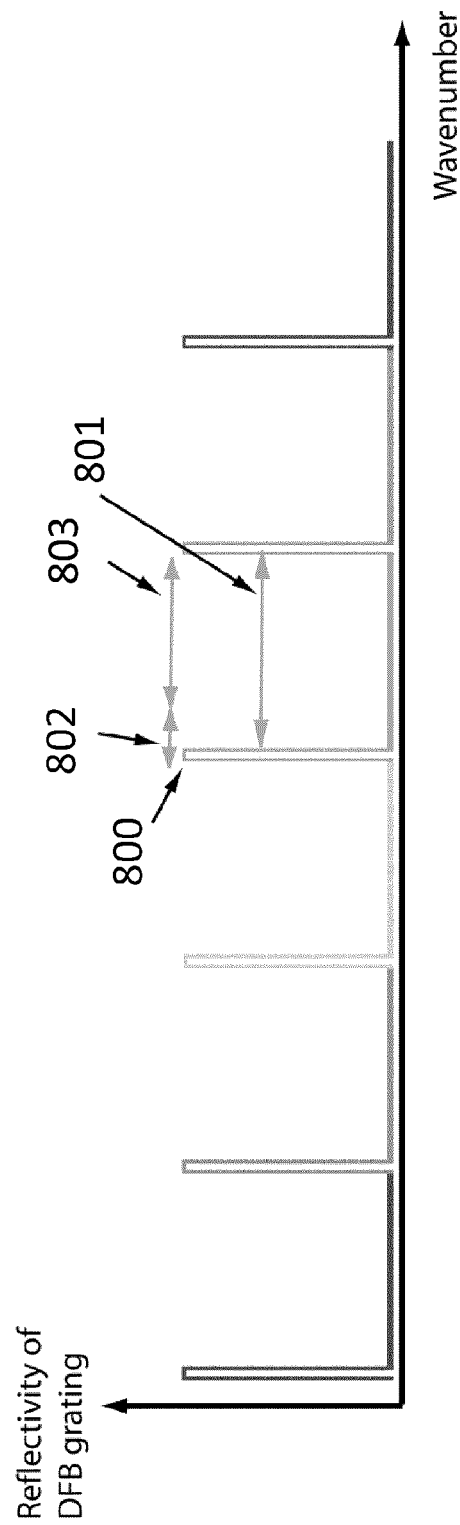
FIG. 8 shows schematically the reflectivity spectrum, the so-called stopband and the tuning range achievable by direct current tuning and by using an heterostructure heater of the Bragg grating in different DFB sections in a DFB QCL array, according to embodiments of the present invention.

Additional embodiments include methods to achieve broadband single mode tuning using a monolithic, single mode QCL source with integrated heaters. This tunable laser source includes at least one QCL section with a Bragg grating aimed at selecting a single emission wavelength and at least one integrated heater. Particular embodiments include a number of DFB QCL sections fabricated monolithically on the same chip and either disposed spatially in an array of parallel elements or placed in series. FIG. 6 shows a top view of an array (600) of independent DFB QCLs (601) fabricated in parallel on the same chip. Individually addressable heterostructure heaters (602) are fabricated in close proximity to each DFB section (601). In one embodiment, at least one QCL power amplifier (603) is integrated between at least one DFB section (601) and the output facet (604) of the laser source, on which an antireflection coating may be deposited. The QCL amplifier makes it possible to increase and to control the power level of the laser source. FIG. 7 shows a schematic top view of a laser source (700) similar to the embodiment shown in FIG. 6, with the exception that the DFB sections (701) and the heterostructure heaters (702) are fabricated in series. In that case, the output of one DFB section (701) is monolithically coupled to the input of the next DFB section (701). The light from one DFB section (701) can travel through subsequent DFB section (701) because the emission wavelength selected by the different DFB sections are by design not overlapping with the wavelength range where the Bragg gratings are highly reflective as shown in FIG. 8. In one embodiment, at least one QCL power amplifier (703) is integrated between at least one DFB section (701) and the output facet (704) of the laser source, on which an antireflection coating may be deposited.

In one embodiment, each of the DFB QCL sections emits at a different wavelength at either end of the so-called stop band (800) of the DFB Bragg grating as shown schematically in FIG. 8. Each DFB QCL section has a different spectral tuning range (801) available, the difference between spectrally adjacent wavelength ranges being essentially equal to or less than the tuning range achievable by current flowing in the QCL elements, i.e. direct current tuning (802) and the tuning range achievable by current flowing in at least one integrated heater (803) in order to enable continuous spectral tuning over at least one spectral range of interest. In another embodiment, continuous spectral coverage may not be of interest and the spectral range covered as a whole by the different DFB sections can be discontinuous. The emission wavelength of the laser source may be tuned over the entire range available by: (1) increasing the current density in one of the DFB sections from the laser threshold $j_{th}$ (typically $j_{th}$ is about 1.25 kA/cm$^2$) up to the current density $j_{sat}$ at which the laser output power saturates (typically $j_{sat}$ is about 3 kA/cm$^2$); (2) increasing the current in at least one heater fabricated close to the DFB section which was switched on during step (1) (during this step, the current in the DFB section is maintained at a value close to $j_{sat}$); (3) turning off the current in both the DFB section and the corresponding heating (tuning) section when emission over the wavelength enabled by following step (1) and (2) is no longer required; (4) repeating steps 1-3 with one or more other DFB sections and corresponding heater(s) until the process has been repeated with all the DFB sections and heaters to cover a spectral range of interest, which can be continuous or not.

In some cases, the amplifier section(s) coupled to the active DFB sections remain(s) electrically pumped at least above the current for keeping optical loss below desired levels. However, for some designs, optical loss(es) in the amplifier section(s) might be low enough to obtain the desired performance without pumping these sections. The amplifier section can be used for example either to maximize the output power or to maintain the power level of the source essentially constant as the emission wavelength is tuned according to the method described. Furthermore, in the case where several DFB sections are connected in series, the DFB sections that are closer to the output facet, it is in most cases advantageous to pump these sections above the transparency current to allow the photons emitted by to reach the power amplifier section or the output facet without being absorbed.

For certain applications, it also may be desirable to use either of the monolithic, single mode QCL sources with integrated heaters described above to provide sequentially single mode emission at one or more wavelengths of interest over a broad spectral range. In that case, one may: (1) select a DFB section and at least one heater that has a tuning range overlapping with at least one wavelength of interest; (2) set the current density in the DFB section and the heater such that the emission wavelength of the DFB section matches the wavelength of interest through temperature tuning; (3) switch off both the DFB section and the heater when emission at the wavelength enabled by following steps (1) and (2) is no longer required; and (4) repeating steps (1)-(3) with the same or another DFB section and heater(s) until emission at all the wavelengths of interest has been achieved. For certain applications, it may be advantageous to have a source emitting at several desired wavelengths simultaneously. In that case, Steps (1) and (2) may be carried out simultaneously with several independent DFB sections and their respective heaters.

In some applications, it may be desirable that the wavelength of at least one DFB section in an array remains essentially constant. Integrated heaters can be also used to maintain one or more selected DFB sections at a particular temperature should that they emit light at essentially constant wavelength(s). In particular, in the case of laser arrays, turning on and off other lasers on the same chip changes the temperature of a given laser. Since for many applications temperature stability (wavelength stability) is crucial, the heaters can be used to compensate for temperature fluctuations and keep the temperature of a device constant. The change in temperature can also be caused by other external factors such as changing heatsink temperature, environment, etc.

Figure 9:
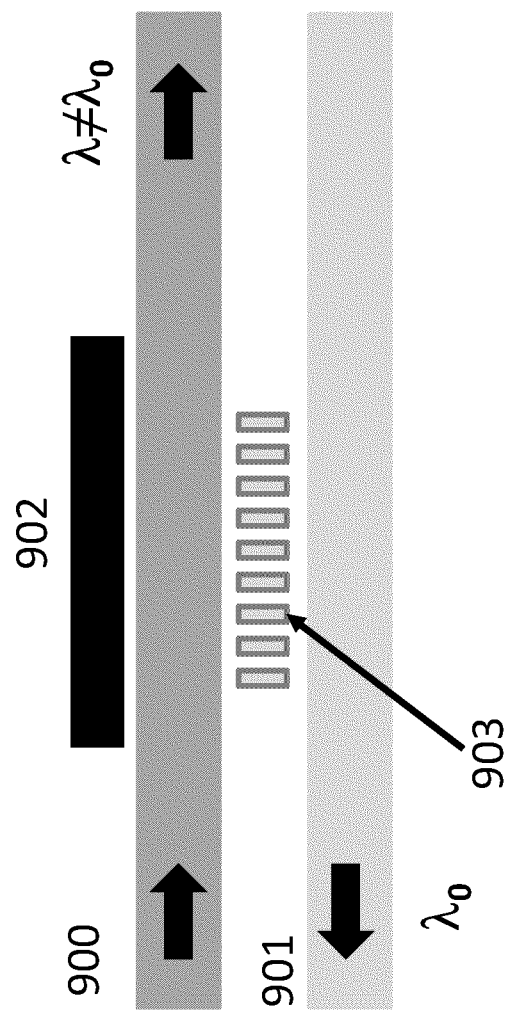
FIG. 9 shows a schematic top view of a contrapropagating grating coupler, which allows the efficient transfer energy from one waveguide to another over a narrow spectral range. The latter can be tuned by adding a heterostructure heater.

In another embodiment, an integrated heterostructure heater can be used in conjunction with a contradirectional grating couplers (CGCs). This type of passive integrated elements are used widely in PIC as they enable efficient transfer of energy between the optical modes of two slightly different passive waveguides, as discussed for example in "Photonics: Optical Electronics in Modern Communications" A. Yariv and P. Yeh, Oxford University Press, p. 522. In FIG. 9, a schematic representation of a CGC with two passive waveguides (900) and (901) and an heterostructure heater (902) is shown. This resonant process requires two waveguides (900) and (901) supporting optical modes with slightly different propagation constants and a grating (903). The period of the grating (903) is designed to fulfill the phase matching condition for the two modes of the waveguides for a particular wavelength $\lambda_0$. The coupling efficiency can be close to 100% over a narrow wavelength range centered around $\lambda_0$ depending on the length of the grating. The coupling is negligible at all other wavelengths. This situation is indicated in FIG. 9 by symbolic arrows. Light at the wavelength $\lambda_0$ and traveling in the waveguide (900) from left to right will be coupled into the waveguide (901) and change its propagation direction. An heterostructure heater can be fabricated in close proximity (5 to 25 μm) to one of the waveguides (900) or (901) in the region where the grating (903) is positioned. By changing the electrical power delivered to the heterostructure heater, the temperature in the vicinity of the CGC can be changed to tune the wavelength $\lambda_0$ at which the coupling efficiency is maximum.

Figure 10:
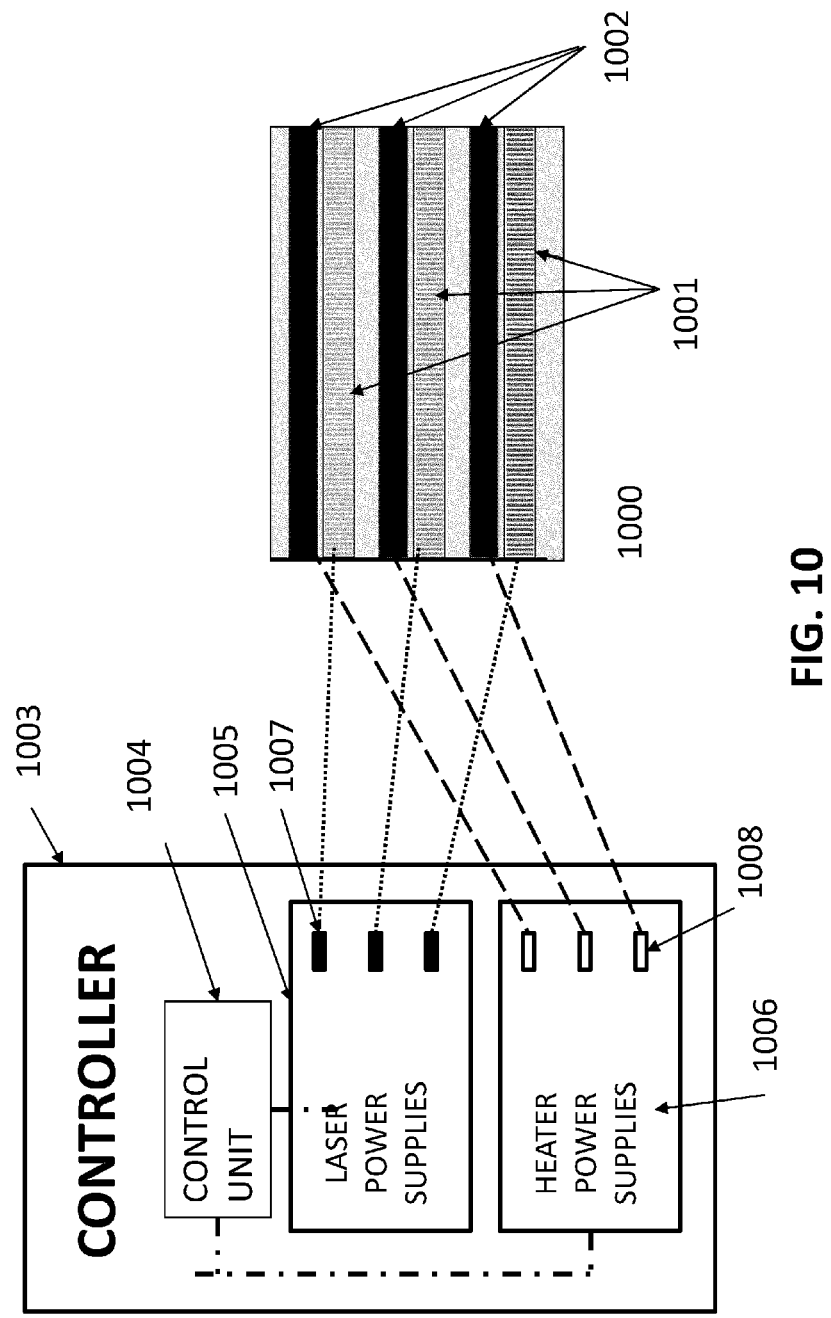
FIG. 10 shows a schematic box diagram of an array of individually addressable and electrically independent DFB QCLs and heterostructure heaters, including a controller.

FIG. 10 shows schematically a monolithic array (1000) (top view) of several DFB QCLs (1001) with integrated heterostructure heaters (1002). Each element in the array is electrically independent from the others and can be addressed individually. The controller (1003) includes a control unit (1004), one or more laser power supplies (1005) to drive electrically the lasers (1001), and one or more heater power supplies (1006) to drive electrically the heterostructure heaters (1002). Each power supply has separated sets of outputs (1007) and (1008), each connected to a laser (1001) or a heterostructure heater (1002), respectively, as shown schematically in FIG. 10 using dashed lines. The control unit (1004) controls the power supplies (1005) and (1006) and is used to turn on and off each element in the array and to set the electrical power delivered to at least one array element according to a specific timing.

In one embodiment, the control unit (1004) is programmable and includes a nonvolatile, nontransitory memory to store information (e.g., in the form of a table, such as a look-up table), including information pertaining to the emission wavelength of each laser element (1001) for various electrical powers provided to the laser element itself and to neighboring heaters (1002). This information can be used to define a set of conditions such as a combination of power to obtain emission at a specific wavelength or over specific spectral ranges from at least one of the DFB QCLs. The embodiment discussed here and shown schematically in FIG. 10 is not limited to DFB QCLs and can be applied to other types of single mode lasers and optical or electrical elements.

The inventive embodiments described herein can be used for applications other than those described above, and also in conjunction with other types of integrated optical or electronic elements such as phase-control sections, couplers, detectors transistors etc. In general, the integrated heterostructure heaters disclosed herein can be used with any integrated element whose functionality can be changed or controlled directly or indirectly by a change of temperature. Similarly, the device and heater geometries can be tailored as desired, e.g., to a specific application. For example, integrated heterostructure heaters can also be implemented with devices soldered epitaxial-side down on a submount.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented and/or controlled in any of numerous ways. For example, the embodiments may be controlled using hardware, software or a combination thereof. When control is implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other nontransitory medium or tangible computer storage medium) encoded with one or more programs that, when executed on one or more computers or other processors, perform methods that implement the various embodiments discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An apparatus, comprising:
   a substrate;
   a semiconductor device integrated onto the substrate, the semiconductor device comprising a quantum cascade laser (QCL) formed of a first ridge of an epitaxial material on the substrate and having at least one temperature-tunable property;
   a heterostructure heater, formed of a second ridge of the epitaxial material on the substrate and integrated onto the substrate and in thermal communication with the semiconductor device, to heat the semiconductor device so as to vary the at least one temperature-tunable property of the semiconductor device, the heterostructure heater comprising a plurality of semiconductor layers; and
   a heat-transfer layer, integrated onto the substrate between the first ridge and the second ridge, to transfer heat from the heterostructure heater to the QCL.

2. The apparatus of claim 1, wherein the heterostructure heater is configured to transform electrical power into heat, via the Joule effect, with an efficiency of more than about 25%.

3. The apparatus of claim 1, wherein the at least one temperature-tunable property comprises an output wavelength of the QCL.

4. The apparatus of claim 3, wherein the heterostructure heater is configured to heat the QCL so as to vary the output wavelength of the at least one of the QCL by about 3 nm to about 600 nm in less than about 1 millisecond.

5. The apparatus of claim 1, wherein the semiconductor device further comprises at least one of a phase shifter, an arrayed waveguide multiplexer, a router, a contra-directional coupler, a MachZehnder interferometer, a filter, a modulator, a resonator, a tapped delay line, and an optical switch, and wherein the at least one temperature-tunable property comprises a refractive index of the at least one of the phase shifter, the arrayed waveguide multiplexer, the router, the contradirectional coupler, the Mach-Zehnder interferometer, the filter, the modulator, the resonator, the tapped delay line, and the optical switch.

6. The apparatus of claim 1, wherein the heterostructure heater comprises at least one quantum well.

7. The apparatus of claim 1, further comprising:
   at least one epitaxial layer that forms at least a portion of the semiconductor device and at least a portion of the heterostructure heater.

8. The apparatus of claim 1, wherein the heterostructure heater is configured to increase in temperature by at least about 50 degrees Kelvin in under about 1 millisecond.

9. The apparatus of claim 1, further comprising:
   a controller, operably coupled to the heterostructure heater, to control a temperature of the heterostructure heater.

10. The apparatus of claim 1, wherein the heat-transfer layer is transparent in a mid-infrared region of the electromagnetic spectrum.

11. The apparatus of claim 1, wherein the first ridge has a width of less than or equal to about 15 μm and the second ridge has a width of greater than or equal to about 30 μm.

12. The apparatus of claim 1, wherein the second ridge has a thickness of about 0.5 μm to about 5 μm.

13. The apparatus of claim 1, wherein the heterostructure heater is configured to increase in temperature by at least about 200 degrees Kelvin in under about 1 millisecond.

14. A method of varying a temperature-tunable property of a semiconductor device integrated onto a substrate, the semiconductor device comprising a quantum cascade laser (QCL) formed of a first ridge of an epitaxial material on the substrate, the method comprising:
   providing a heterostructure heater formed of a second ridge of the epitaxial material on the substrate, the heterostructure heater being integrated onto the substrate and in thermal contact with the semiconductor device, the heterostructure heater comprising a plurality of semiconductor layers;
   providing a heat transfer layer integrated onto the substrate between the first ridge and the second ridge; and
   controlling electrical power injected into the heterostructure heater so as to transfer heat from the heterostructure heater to the QCL via the heat transfer layer.

15. The method of claim 14, further comprising:
   injecting the electrical power into the heterostructure heater at a current density of up to about 10 kA/cm$^2$.

16. The method of claim 14, further comprising:
   determining a desired temperature of the semiconductor device associated with a particular value of the temperature-tunable property of the semiconductor device; and
   adjusting the electrical power injected into the heterostructure heater based on the comparison so as to bring the temperature of the semiconductor device closer to the desired temperature.

17. The method of claim 14, wherein the QCL comprises a first laser and the temperature-tunable property of semiconductor device comprises a first output wavelength of the first laser, and further comprising:
   adjusting the electrical power injected into the heterostructure heater so as to tune the first output wavelength over a first wavelength range about 3 nm to about 600 nm in less than about 1 millisecond.

18. The method of claim 17, wherein the semiconductor device further comprises a second laser and the temperature-tunable property of semiconductor device further comprises a second output wavelength of the second laser, and further comprising:

adjusting the electrical power injected into the heterostructure heater so as to tune the second output wavelength over a second wavelength range contiguous with or overlapping the first wavelength range.

19. A tunable laser array comprising:
a substrate;
a plurality of quantum cascade lasers (QCLs) integrated onto the substrate, the plurality of QCLs comprising at least one QCL formed of a first ridge of an epitaxial material on the substrate;
a plurality of heterostructure heaters integrated onto the substrate, each heterostructure heaters in the plurality of heterostructure heaters having at least one respective electrode to receive current for causing the respective heterostructure heater to change in temperature, wherein the plurality of heterostructure heaters comprises at least one heterostructure heater formed of a second ridge of the epitaxial material on the substrate and comprising a plurality of semiconductor layers, the at least one heterostructure heater being in thermal communication with the at least one QCL in the plurality of temperature-tunable QCLs, to heat the at least one QCL so as to vary an output wavelength of the at least one QCL; and
a heat transfer layer, integrated onto the substrate between the first ridge and the second ridge, to transfer heat from the at least one heterostructure heater to the at least one QCL.

20. The tunable laser array of claim 19, wherein the at least one heterostructure heater comprises a plurality of quantum wells.

21. The tunable laser array of claim 19, wherein the at least one heterostructure heater has a width of about 12 μm to about 40 μm and is disposed within about 5 μm to about 25 μm of the at least one QCL.

22. The tunable laser array of claim 19, wherein the at least one heterostructure heater is configured to heat the at least one QCL so as to continuously vary the output wavelength of the at least one QCL by about 3 nm to about 600 nm in less than about 1 millisecond.

23. The tunable laser array of claim 19, further comprising:
a controller, operably coupled to the plurality of heterostructure heaters, to control the at least one heterostructure heater so as to tune the output wavelength of the at least one QCL to a desired wavelength.

* * * * *